(12) United States Patent
Sumitomo

(10) Patent No.: US 8,575,986 B2
(45) Date of Patent: Nov. 5, 2013

(54) LEVEL SHIFT CIRCUIT AND SWITCHING REGULATOR USING THE SAME

(75) Inventor: Hironori Sumitomo, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 13/243,615

(22) Filed: Sep. 23, 2011

(65) Prior Publication Data

US 2012/0075001 A1      Mar. 29, 2012

(30) Foreign Application Priority Data

Sep. 27, 2010  (JP) ................................ 2010-215575

(51) Int. Cl.
*H03L 5/00*  (2006.01)

(52) U.S. Cl.
USPC .............. 327/333; 327/390; 327/589; 326/81

(58) Field of Classification Search
USPC ................ 327/333, 390, 589; 326/68, 80, 81; 365/189.11; 323/271, 282, 288
See application file for complete search history.

(56) References Cited

U.S. PATENT DOCUMENTS

| | | | |
|---|---|---|---|
| 2008/0238525 A1* | 10/2008 | Flaibani et al. | 327/333 |
| 2009/0315609 A1* | 12/2009 | Nakazono | 327/333 |
| 2012/0049829 A1* | 3/2012 | Murakami | 323/288 |

FOREIGN PATENT DOCUMENTS

| | | |
|---|---|---|
| JP | 5-308274 | 11/1993 |
| JP | 2002-190731 | 7/2002 |
| JP | 2003-235251 | 8/2003 |

\* cited by examiner

*Primary Examiner* — Long Nguyen
(74) *Attorney, Agent, or Firm* — Hamre, Schumann, Mueller & Larson, P.C.

(57) ABSTRACT

A level shift circuit includes an input port to which an input signal is input, a first signal amplifying unit configured to amplify the input signal input to the input port, a node at the first signal amplifying unit to output the amplified signal, a level shift input port to which a level shift voltage for controlling a DC level of the node is input, a first supply voltage configured to drive the first signal amplifying unit, and a level shift voltage generation circuit configured to generate the first supply voltage and the level shift voltage.

9 Claims, 11 Drawing Sheets

100

100

100

US 8,575,986 B2

LEVEL SHIFT CIRCUIT AND SWITCHING REGULATOR USING THE SAME

CROSS-REFERENCE TO RELATED APPLICATION

This application is based upon and claims the benefit of priority from Japanese Patent Application No. 2010-215575, filed on Sep. 27, 2010, the entire contents of which are incorporated herein by reference.

TECHNICAL FIELD

The present disclosure relates to a level shift circuit and a switching regulator using the same, and more particularly relates to a technique of using a wide range of power supply voltage without having to increase a gate withstand voltage of a transistor when the power supply voltage is increased.

BACKGROUND

Japanese Patent Laid-Open Publication No. H5-308274 ("Patent Document 1") discloses a CMOS level shift circuit. The CMOS level shift circuit disclosed in Patent Document 1 obtains a signal output of a high voltage level by a circuit configuration of a MOS transistor having a small withstand voltage between a gate and a source. Also, Patent Document 1 (see paragraph 0008) discloses that, in general, a MOS transistor can easily increase a withstand voltage $BV_{SD}$ between a source and a drain but has difficulty in increasing a withstand voltage $BV_{GS}$ between a gate and a source, due to the structure of the MOS transistor.

FIG. 10 shows a CMOS level shift circuit illustrated in FIG. 1 of Patent Document 1. In FIG. 10, a gate G of an n type MOS transistor 14 is connected to an input port IN of an inverter 8, and a signal having a low voltage level is input to the input port IN of the inverter 8. Respective gates G of n type MOS transistors 11 and 16 are commonly connected to an output terminal of the inverter 8. Respective sources S of the n type MOS transistors 11, 14, and 16 are commonly connected to a ground terminal Vss. Also, a drain D of a p type MOS transistor 10 is connected to a drain D of the n type MOS transistor 11, and a drain D of a p type MOS transistor 13 is connected to a drain D of the n type MOS transistor 14. Respective gates G of the p type MOS transistors 10 and 13 are commonly connected to a prescribed bias voltage VB. The bias voltage VB is selected as VDD−BVGS. Here, VDD is a power supply voltage, and BVGS is a withstand voltage between the source and gate of the p type MOS transistors 10 and 13.

In FIG. 10, a source S of a p type MOS transistor 10 is connected to a drain D of a p type MOS transistor 9 and a gate G of a p type MOS transistor 12. A source S of the p type MOS transistor 13 is commonly connected to gates G of the p type MOS transistors 9 and 15 and a drain D of the p type MOS transistor 12. Respective sources S of the p type MOS transistors 9, 12, and 15 are commonly connected to the power supply voltage VDD.

According to Paragraph 0018 of Patent Document 1, the bias voltage (VB=VDD−BVGS) is applied to the gates G of the p type MOS transistors 10 and 13. Thus, the voltages between the sources and gates of these transistors are lower than the withstand voltage BVGS.

According to Paragraphs 0019 and 0020, respective sources S and drains D of the p type MOS transistors 10 and 13 are connected between respective drains D of the p type MOS transistors 9 and 12 whose sources S are connected to the power supply voltage VDD and respective drains D of the n type MOS transistors 11 and 14 whose sources S are grounded, and the prescribed bias voltage, which does not exceed a difference between the power supply voltage VDD and the withstand voltage BVGS between the source and gate of the p type MOS transistor, is applied to the gates of the p type MOS transistors 10 and 13, whereby the voltages between the sources and gates of the p type MOS transistors 10 and 13 are lower than the withstand voltage BVGS. Accordingly, the CMOS level shift circuit is configured with a MOS transistor having a small withstand voltage BVGS between the source and gate. In other words, Patent Document 1 proposes a circuit configuration in consideration of the withstand voltage between the sources and gates of the p type MOS transistors 10 and 13.

Japanese Patent Laid-Open Publication No. 2002-190731 ("Patent Document 2") discloses a level shift circuit and a semiconductor device. The level shift circuit disclosed in Patent Document 2 may prevent damage to a transistor configured with low withstand voltage elements. Thus, similar to Patent Document 1, Patent Document 2 suggests a technical concept which considers a withstand voltage of the level shift circuit.

FIG. 11 shows the level shift circuit illustrated in FIG. 1 of Patent Document 2, in which reference numerals are changed and some reference numerals are added.

A level shift circuit 20 includes an input circuit 21, a shift circuit 22, and a voltage generation circuit 23. The level shift circuit 20 is supplied with two power supply voltages, namely, a low power supply voltage VD1 and a high power supply voltage VD2. The input circuit 21 is operated by the low power supply voltage VD1, and the shift circuit 22 and the voltage generation circuit 23 are operated by the high power supply voltage VD2. The level shift circuit 20 converts an input signal IN having a low power supply voltage VD1 into an output signal OUT having a high power supply voltage VD2.

The input circuit 21 is configured as an inverter circuit including a first p channel MOS transistor (hereinafter, referred to as a "pMOS transistor") Q21 and a first n channel MOS transistor (hereinafter, referred to as an "nMOS transistor") Q22.

A source S of the first pMOS transistor Q21 is connected to the low power supply voltage VD1, and a source S of the first nMOS transistor Q22 is connected to ground GND. In the input circuit 21, the input signal IN is supplied to a common gate G of the first pMOS transistor Q21 and the first nMOS transistor Q22, and an inverted input signal /IN obtained by inverting the input signal IN is output to a common drain D. In other words, in response to the input signal IN, the input circuit 21 outputs the input signal IN and the inverted input signal /IN to the shift circuit 22.

The shift circuit 22 includes first to sixth transistors Q23 to Q28. First and second transistors Q23 and Q24 are pMOS transistors, and third to sixth transistors Q25 to Q28 are nMOS transistors.

Sources of the first and second transistors Q23 and Q24 are connected to the high power supply voltage VD2, and gates G thereof are connected to drains D of the second and first transistors Q24 and Q23.

Sources S of the third and fourth transistors Q25 and Q26 are connected to ground GND. The inverted input signal /IN is supplied to a gate G of the third transistor Q25, and the input signal IN is supplied to a gate G of the fourth transistor Q26. Drains D of the third and fourth transistors Q25 and Q26 are connected to sources S of fifth and sixth transistors Q27 and Q28, respectively.

Respective drains D of the fifth and sixth transistors Q27 and Q28 are connected to respective drains D of the first and second transistors Q23 and Q24. Gates G of the fifth and sixth transistors Q27 and Q28 are commonly connected to the voltage generation circuit 23. An output signal OUT is output from a common connection point between the drain D of the first transistor Q23 and the drain D of the fifth transistor Q27.

The third and fourth transistors Q25 and Q26 are configured with low withstand voltage elements, each having a low element withstand voltage, such that they can be turned on or off in response to the input signal IN and the inverted input signal /IN supplied to the respective gates G. Meanwhile, the first and second transistors Q23 and Q24 and the fifth and sixth transistors Q27 and Q28 are configured with high withstand voltage elements whose element withstand voltage is set to correspond to the high power supply voltage VD2.

The voltage generation circuit 23 includes transistors Q29 to Q36. A prescribed bias voltage Vn11 is taken from a node N11 installed between the high power supply voltage VD2 and ground GND, and the bias voltage Vn11 is supplied to the common gate G of the fifth and sixth transistors Q27 and Q28. Meanwhile, the voltage generation circuit 23 generates the gate voltage of the fifth and sixth transistors Q27 and Q28, i.e., the bias voltage Vn11, such that the third and fourth transistors Q25 and Q26, which are low withstand voltage elements, do not break. The voltage generation circuit 23 turns on the transistor Q29 and turns off the transistor Q35 using a high level control signal CNTL. An inverter circuit comprised of the transistors Q29 and Q35 outputs a low level signal to a gate of the transistor Q30 to turn on the transistor Q30.

In FIG. 11, the high power supply voltage VD2 is set to be, for example, 3V and the low power supply voltage VD1 is set to be, for example, 1V. A withstand voltage between the sources and drains of the third and fourth transistors Q25 and Q26, which are low withstand voltage elements, is set to be 1.5V, and a withstand voltage between the source and drains of the first, second, fifth, and sixth transistors Q23, Q24, Q27, and Q28, which are high withstand voltage elements, is set to be 3.0V. The voltage between the gates and sources of the high withstand voltage elements is set to be 0.5V. Accordingly, the bias voltage Vn11 generated by the voltage generation circuit 23 and supplied to the gate G of the fifth and sixth nMOS transistors Q27 and Q28 is about half of the high power supply voltage VD2 and does not break the third and fourth transistors Q25 and Q26.

The third and fourth transistors Q25 and Q26 are configured with low withstand voltage elements which are driven by the low power supply voltage VD1 and have a low withstand voltage between a source and drain thereof. Based on the high power supply voltage VD2, the bias voltage Vn11 which does not break the third and fourth transistors Q25 and Q26 is generated by the voltage generation circuit 23 and supplied to the gates G of the fifth and sixth transistors Q27 and Q28. Accordingly, when the first and second transistors Q23 and Q24 are turned on, the high power supply voltage VD2, exceeding the withstand voltage between the source and drain, is prevented from being applied to the third and fourth transistors Q25 and Q26. Namely, by limiting the voltage applied from the high power supply voltage VD2, the third and fourth transistors Q25 and Q26 configured with low withstand voltage elements are prevented from being broken.

Japanese Patent Laid-Open Publication No. 2003-235251 ("Patent Document 3"), which was filed by the applicant of the present application, discloses a switching regulator. In particular, Patent Document 3 discloses the use of a bootstrap circuit as a voltage supply of a level shift circuit.

Patent Document 1 focuses on a withstand voltage of a MOS transistor constituting a level shift circuit. However, it does not suggest the use of the level shift circuit for a switching regulator. Patent Document 2 suggests a voltage generation circuit which prevents damage to transistors constituting a level shift circuit. However, since the voltage generation circuit is configured to respond to a control signal CNTL, the circuit configuration is complicated. Patent Document 3 discloses a level shift circuit and a switching regulator, but does not suggest operating the level shift circuit depending on the operation of the switching regulator.

SUMMARY

The present disclosure provides some embodiments of a level shift circuit capable of lowering a withstand voltage and optimizing a circuit operating point and a switching regulator having a small size, in consideration of Patent Documents 1 to 3.

In the present disclosure, a diode element is defined as an electronic device having at least two electrodes capable of controlling a flow of current only in one direction. Thus, the diode element includes a transistor, as well as a diode. The reason is because the transistor includes at least three electrodes and may be configured with a diode having two electrodes. Also, by controlling control electrodes such as a gate electrode, a base electrode, and the like of the transistor, a flow of current can be controlled only uni-directionally, rather than bi-directionally, so the transistor can substantially perform the same circuit operation as that of a diode.

Further, in the present disclosure, a bootstrap circuit is defined as a circuit configured to generate a first supply voltage by a combination of the diode element and a capacitor.

Also, in the present disclosure, a bootstrap voltage is defined as a supply voltage generated from the bootstrap circuit.

A level shift circuit according to one embodiment of the present disclosure includes an input port to which an input signal is input, a first signal amplifying unit configured to amplify the input signal input to the input port, a node at the first signal amplifying unit to output the amplified signal, a level shift input port to which a level shift voltage for controlling a DC level of the node is input, a first supply voltage configured to drive the first signal amplifying unit, and a level shift voltage generation circuit configured to generate the first supply voltage and the level shift voltage.

DETAILED DESCRIPTION (First Embodiment)

Figure 1:
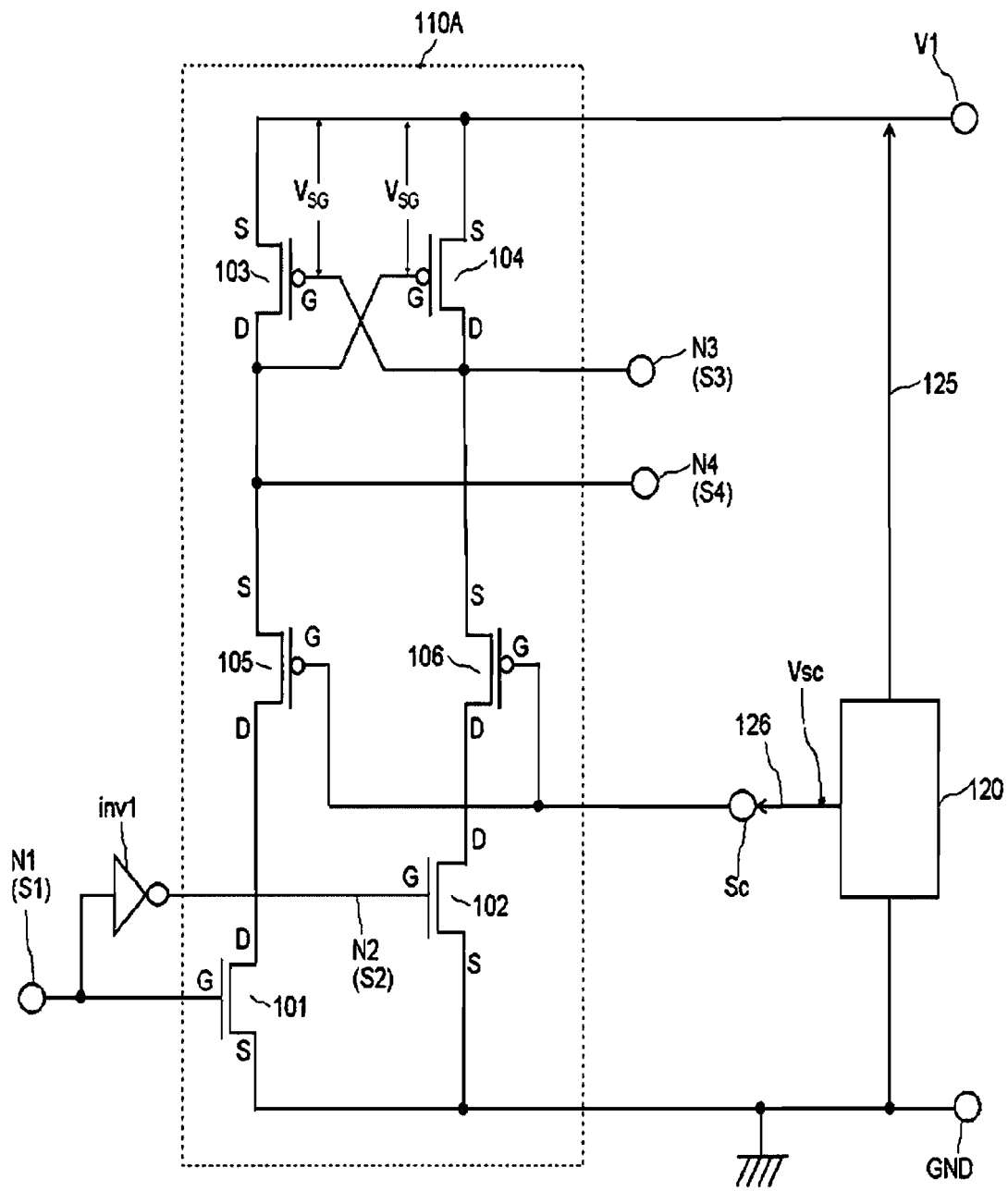
FIG. 1 is a circuit diagram showing a level shift circuit according to a first embodiment of the present disclosure.

FIG. 1 is a circuit diagram showing a level shift circuit according to a first embodiment of the present disclosure. The level shift circuit 100 illustrated in FIG. 1 includes a pair of input transistors 101 and 102. The input transistors 101 and 102 are configured as first conductive type, e.g., n channel type, MOS transistors.

The input transistors 101 and 102 are disposed between a supply voltage V1 and a reference potential GND, and sources of the input transistors 101 and 102 are commonly connected to the reference potential GND.

The level shift circuit 100 further includes a pair of load transistors 103 and 104 configured as second conductive type p channel MOS transistors. The load transistors 103 and 104 are disposed between the supply voltage V1 and the reference potential GND, and sources of those transistors are connected together to the supply voltage V1.

A pair of level shift transistors 105 and 106 is configured as second conductive type p channel MOS transistors. The level shift transistors 105 and 106 are disposed between the pair of input transistors 101 and 102 and the pair of load transistors 103 and 104.

An input signal S1 is input to an input node N1 and an input terminal of an inverter inv1. Thus, the input signal S1 is input to a gate G of the input transistor 101 and the inverter inv1 is connected to the input node N1. The input signal S1 is inverted in the inverter inv1 to be an input signal S2. At a node N2, the input signal S2 is input to a gate G of the input transistor 102. Thus, input signals having different polarities are input to the respective gates G of the input transistors 101 and 102. In other words, the input transistors 101 and 102 constitute a differential type differential amplifier.

A gate G of the load transistor 103 is connected to a drain D of the load transistor 104 to form a node N3, and a gate G of the load transistor 104 is connected to a drain D of the load transistor 103 to form a node N4. In general, the configuration in which first and second gates of a pair of MOS transistors are respectively connected to drains of the second and first transistors is called a cross-link. Both the load transistors 103 and 104 are configured as p channel MOS transistors, and both of the load transistors 103 and 104 are placed to have the relationship of a pair of cross-link transistors.

An output signal S3 is output from the node N3 and an output signal S4 is output from the node N4. The output signal S3 has the same polarity as that of the input signal S1, and the output signal S4 has the opposite polarity of the input signal S1, namely, has the same polarity as that of the input signal S2. As will be described later, a DC level of each of the output signals S3 and S4 is determined by a voltage applied to each gate G of the pair of level shift transistors 105 and 106.

The pair of level shift transistors 105 and 106 are disposed between the input transistors 101 and 102 and the load transistors 103 and 104. A drain D and a source S of the level shift transistor 105 are connected to the drain D of the input transistor 101 and the drain D of the load transistor 103, respectively. A drain D and a source S of the level shift transistor 106 are connected to the drain D of the input transistor 102 and the drain D of the load transistor 104, respectively.

In other words, source-drain conductive paths of the load transistor 103, the level shift transistor 105, and the input transistor 101 are connected in series between the supply voltage V1 and the reference potential GND.

Similarly, source-drain conductive paths of the load transistor 104, the level shift transistor 106, and the input transistor 102 are connected in series between the supply voltage V1 and the reference potential GND.

Respective gates G of the level shift transistors 105 and 106 are commonly connected to a level shift input port Sc. A level shift voltage Vsc generated from a level shift voltage generation circuit 120 is applied to the level shift input port Sc. The level shift voltage Vsc is set to be increased when the supply voltage V1 is increased, and decreased when the supply voltage V1 is reduced. The level shift voltage Vsc can be increased or decreased by the same amount as an increased or reduced voltage of the supply voltage V1. For example, when the supply voltage V1 is increased by 5V, the level shift voltage Vsc can be increased by 5V, and when the supply voltage V1 is reduced by 5V, the level shift voltage Vsc can be decreased by 5V. Meanwhile, as for a detailed circuit configuration of the level shift voltage generation circuit 120, which will become obvious in the following description, a so-called bootstrap circuit, in which a diode element Di and a capacitor C2 are connected in series and a voltage is output from a common connection point of the diode element Di and the capacitor C2, for example, may be used.

The level shift voltage Vsc is applied to the gates G of the level shift transistors 105 and 106, and further transferred to the sources S of these transistors, namely, to the nodes N3 and N4. Accordingly, a voltage $V_{SG}$ between the sources S and the gates G (drains D) of the load transistors 103 and 104 remains constant although the supply voltage V1 is increased or decreased, and the voltage applied to the load transistors 103 and 104 is not cooperatively increased or decreased depending on the size of the supply voltage V1. Therefore, even when the supply voltage V1 is relatively high, a voltage applied to the load transistors 103 and 104 does not exceed a prescribed voltage level, thus realizing a low withstand voltage of the load transistors 103 and 104.

If the size of the level shift voltage Vsc is uniform regardless of the size of the supply voltage V1, the voltage $V_{SG}$ between the voltage supply V1 and the nodes N3 and N4 is dependent upon the size of the supply voltage V1, and when the supply voltage V1 is increased, or when the supply voltage V1 is relatively high (e.g., 10V~100V), the voltage between the sources S and the gates S (drains D) of the load transistors 103 and 104 is increased, so a transistor of a high withstand voltage (e.g., 100V or more) is required. This is not desirable.

The major characteristics of the level shift circuit 100 according to the present disclosure are that it includes the level shift voltage generation circuit 120. The level shift voltage generation circuit 120 generates two voltages, i.e., the supply voltage V1 and the level shift voltage Vsc. The supply voltage V1 is required to operate a first signal amplifying unit 110A. The level shift voltage Vsc determines a circuit operating point of the first signal amplifying unit 110A. In other words, a dynamic range of the first signal amplifying unit 110A is determined by the level shift voltage Vsc. It should be noted that a voltage is not supplied from the supply voltage V1 to the level shift voltage generation circuit 120, but the supply voltage V1, by which the first signal amplifying unit 110A is operated, is generated by the level shift voltage generation circuit 120. Thus, the level shift voltage generation circuit 120 operates independently from the supply voltage V1. One of the two voltages generated by the level shift voltage generation circuit 120 is supplied to the supply voltage V1 through a voltage supply line 125 and the other of the two voltages, i.e., the voltage Vsc is supplied to the common gates G of the level shift transistors 105 and 106 through a voltage supply line 126.

When the level shift voltage Vsc is input to the common gates G of the level shift transistors 105 and 106, the potential of the sources S of the level shift transistors 105 and 106, namely, the potentials of the nodes N3 and N4 are uniquely determined based on the size of the level shift voltage Vsc.

When the potentials of the nodes N3 and N4 are determined to have a prescribed size, the voltage $V_{SG}$ between the supply voltage V1 and the node N3 is determined. The voltage $V_{SG}$ may be constantly uniform, without being dependent upon the size of the supply voltage V1. In this case, the withstand voltage between the sources and drains (gates) of the load transistors 103 and 104 does not need to be considered. Conventionally, when the supply voltage V1 is increased, the withstand voltage of the load transistors should be considered. However, when the size of the supply voltage V1 does not need to be considered as in this embodiment, the level shift circuit 100 can realize a high density with transistor elements having a low withstand voltage, which will be advantageous.

(Second Embodiment)

Figure 2:
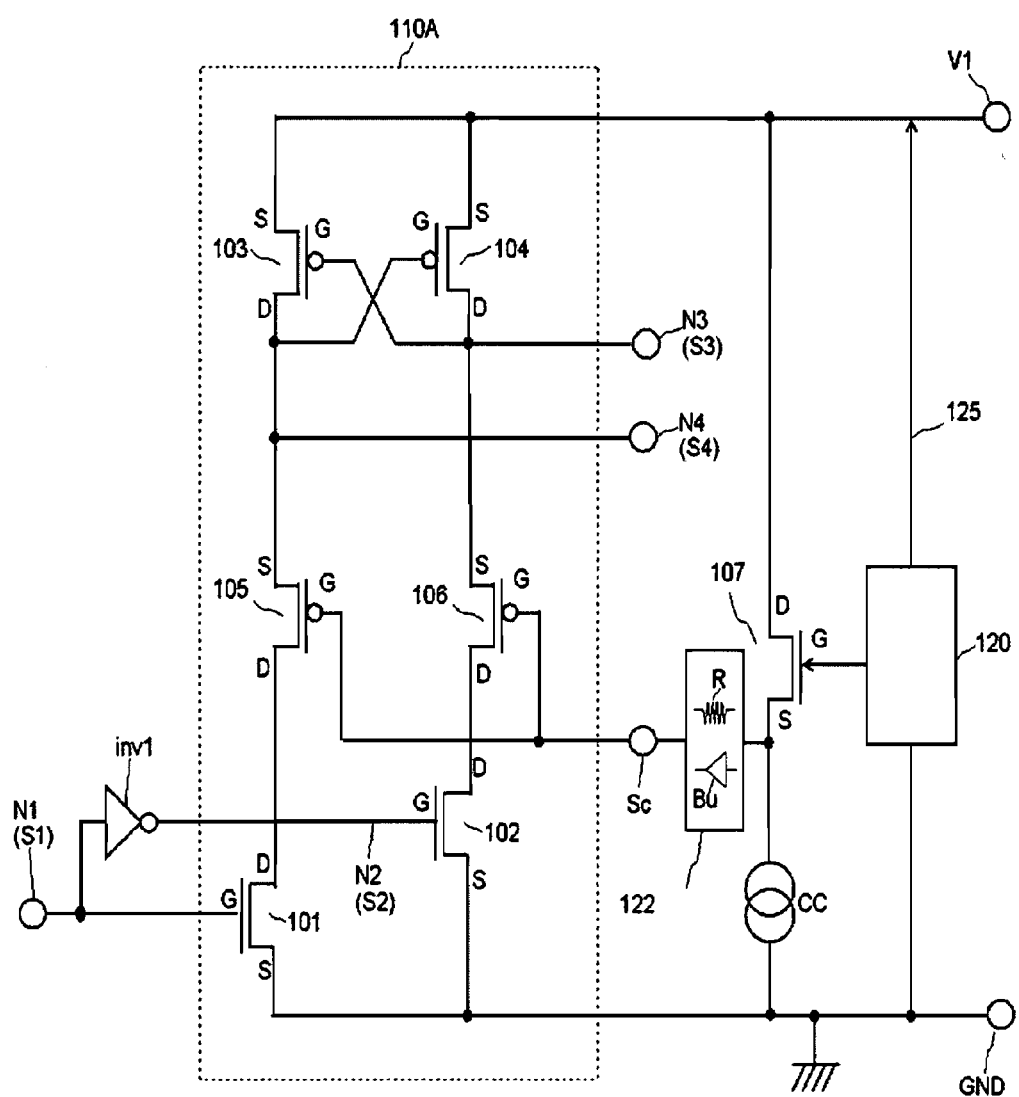
FIG. 2 is a view showing a modification of the level shift circuit according to the first embodiment.

FIG. 2 is a view showing a modification of the level shift circuit according to the first embodiment. FIG. 2 is related to a second embodiment. A basic circuit configuration of the second embodiment is the same as that of the first embodiment illustrated in FIG. 1. Namely, the level shift circuit 100 includes the first signal amplifying unit 110A and the level shift voltage generation circuit 120. The first signal amplifying unit 110A has the pair of input transistors 101 and 102. Also, the first signal amplifying unit 110A has the pair of load transistors 103 and 104. In addition, the first signal amplifying unit 110A has the pair of level shift transistors 105 and 106. Further, the input signal 51 is input to the input port N1, and the output signals S3 and S4 are output from the nodes N3 and N4, respectively. This configuration is the same as that of the first embodiment.

The configuration of FIG. 2 is different from that of FIG. 1, in that a transistor 107 is installed between the level shift voltage generation circuit 120 and the level shift input port Sc, and additionally, a constant current source CC is connected to a source S of the transistor 107 to form a so-called source follower, and a level shift unit 122 is installed between the source S of the transistor 107 and the level shift input port Sc. The level shift unit 122 divides a source follower voltage of the transistor 107 with a resistor R and decreases or increases the level shift voltage output from the level shift voltage generation circuit 120 via a buffer BU, to output a DC voltage, which has been controlled to have a prescribed level, to the level shift input port Sc.

Namely, the transistor 107 and the level shift unit 122 are prepared to couple the level shift transistors 105 and 106 with the level shift voltage generation circuit 120, and serve to adjust the output signals S3 and S4, which are output to the nodes N3 and N4, such that they have a prescribed DC level (e.g., a value from a range of 3~5V).

The level shift circuit 100 illustrated in FIG. 2 has characteristics that the level shift voltage Vsc is applied to the level shift input port Sc from the level shift voltage generation circuit 120 through the level shift unit 122 configured with a transistor, a buffer circuit, or the like. Employing this configuration, the level shift voltage generation circuit 120 and the first signal amplifying unit 110A can be coupled to each other to have a desired state including temperature dependency of various characteristics.

(Third Embodiment)

Figure 3:
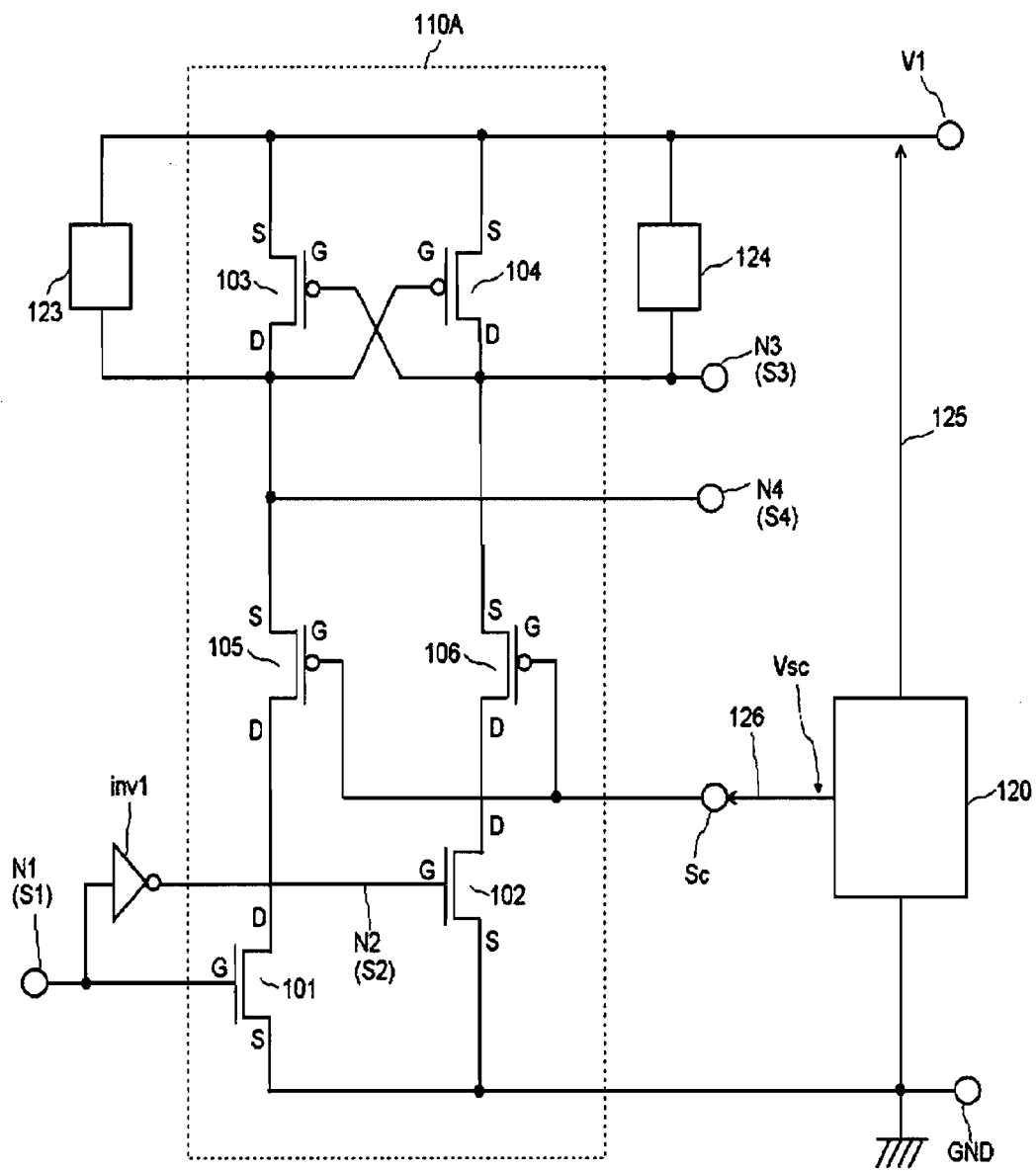
FIG. 3 is a view showing another modification of the level shift circuit according to the first embodiment.

FIG. 3 is a view showing another modification of the level shift circuit according to the first embodiment. FIG. 3 is related to a third embodiment of the present disclosure. The circuit configuration of FIG. 3 is basically the same as that of the first embodiment illustrated in FIG. 1. Namely, the level shift circuit 100 includes the first signal amplifying unit 110A and the level shift voltage generation circuit 120. The first signal amplifying unit 110A includes the pair of input transistors 101 and 102. Also, the first signal amplifying unit 110A includes the pair of load transistors 103 and 104. Further, the first signal amplifying unit 110A includes the pair of level shift transistors 105 and 106. In addition, the input signal 51 is input to the input port N1, and output signals S3 and S4 are output from the nodes N3 and N4, respectively. Such a configuration is the same as that of the first embodiment.

The configuration of FIG. 3 is different from that of FIG. 1, in that constant voltage circuits 123 and 124 are installed at the sides of the pair of load transistors 103 and 104, respectively. In other words, the constant voltage circuit 123 is connected in parallel to a source-drain conductive path of the load transistor 103. Also, the constant voltage circuit 124 is connected in parallel to a source-drain conductive path of the load transistor 104. The constant voltage circuits 123 and 124 may be configured as, for example, Zener diodes, and cathodes and anodes of the Zener diodes are connected to the supply voltage V1 and the node N3 or N4, respectively. Also, the constant voltage circuits 123 and 124 may be configured as a plurality of general diodes connected in series. With this configuration, when a voltage exceeding the withstand voltage of the load transistors 103 and 104 is applied between the source S and the drain D (gate G) of each of the load transistors 103 and 104, the voltage can be bypassed to the Zener diodes or the plurality of general diodes, thus preventing the load transistors 103 and 104 from degrading or becoming non-operational. Of course, the circuit configuration illustrated in FIG. 2 may be added to the circuit configuration of FIG. 3.

(Fourth Embodiment)

Figure 4:
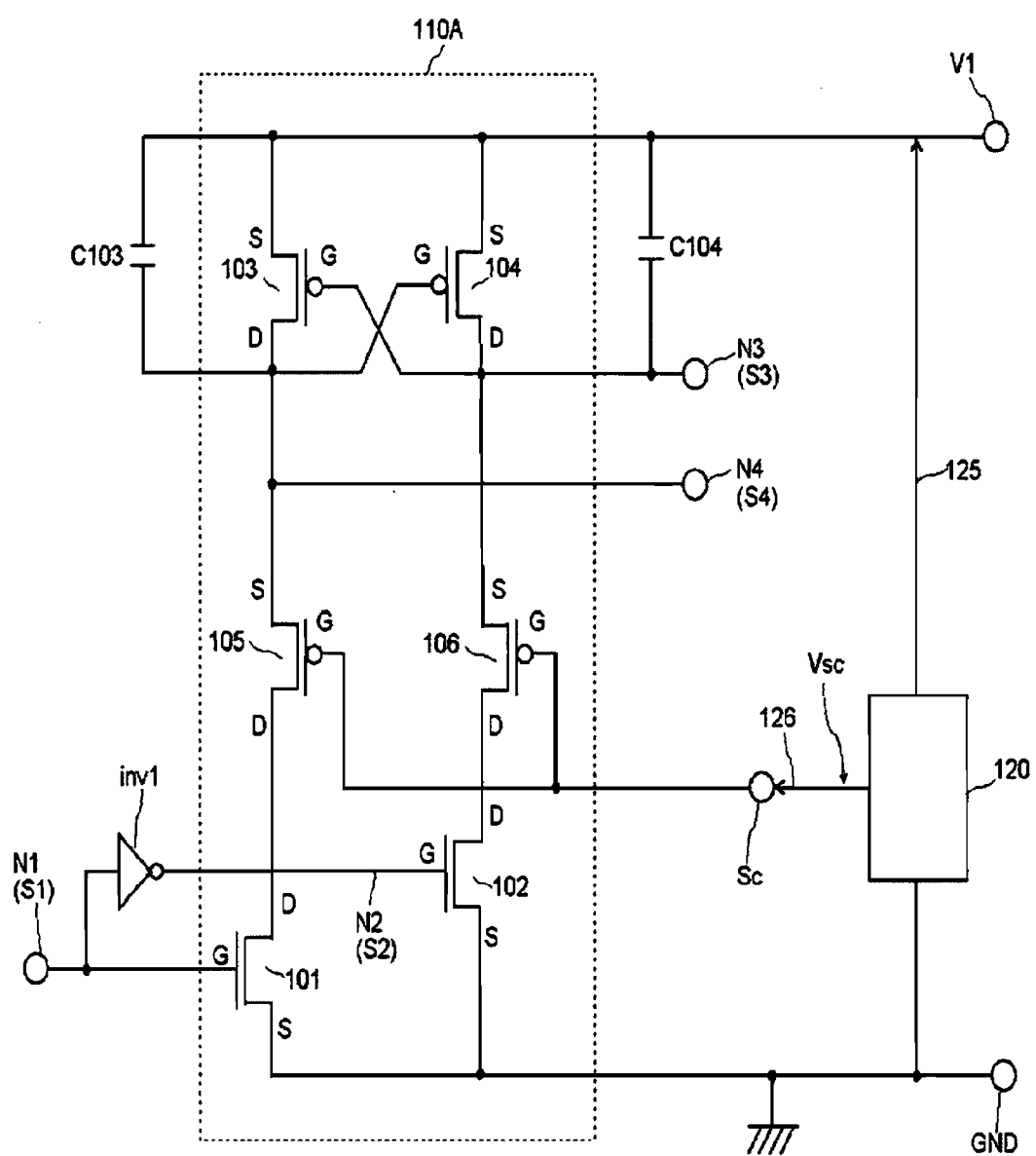
FIG. 4 is a view showing another modification of the level shift circuit according to the first embodiment.

FIG. 4 is a view showing another modification of the level shift circuit according to the first embodiment. FIG. 4 is related to a fourth embodiment of the present disclosure. The circuit configuration of FIG. 4 is basically the same as the first embodiment illustrated in FIG. 1. Namely, the level shift circuit 100 includes the first signal amplifying unit 110A and the level shift voltage generation circuit 120. The first signal amplifying unit 110A includes the pair of input transistors 101 and 102. Also, the first signal amplifying unit 110A includes the pair of load transistors 103 and 104. In addition, the first signal amplifying unit 110A includes the pair of level shift transistors 105 and 106. Further, the input signal S1 is input to the input port N1, and output signals S3 and S4 are output from the nodes N3 and N4, respectively. Such a configuration is the same as that of the first embodiment.

The configuration of FIG. 4 is different from that of FIG. 1, in that capacitors C103 and C104 are installed at the sides of the pair of load transistors 103 and 104. In other words, the capacitor C103 is connected between the source S and the drain D of the load transistor 103, and the capacitor C104 is connected between the source S and the drain D of the load transistor 104. With this configuration, for example, even if noise is generated from the nodes N3 and N4 and the supply voltage V1 for some reason, it can be canceled by the capacitors C103 and C104.

(Fifth Embodiment)

Figure 5:
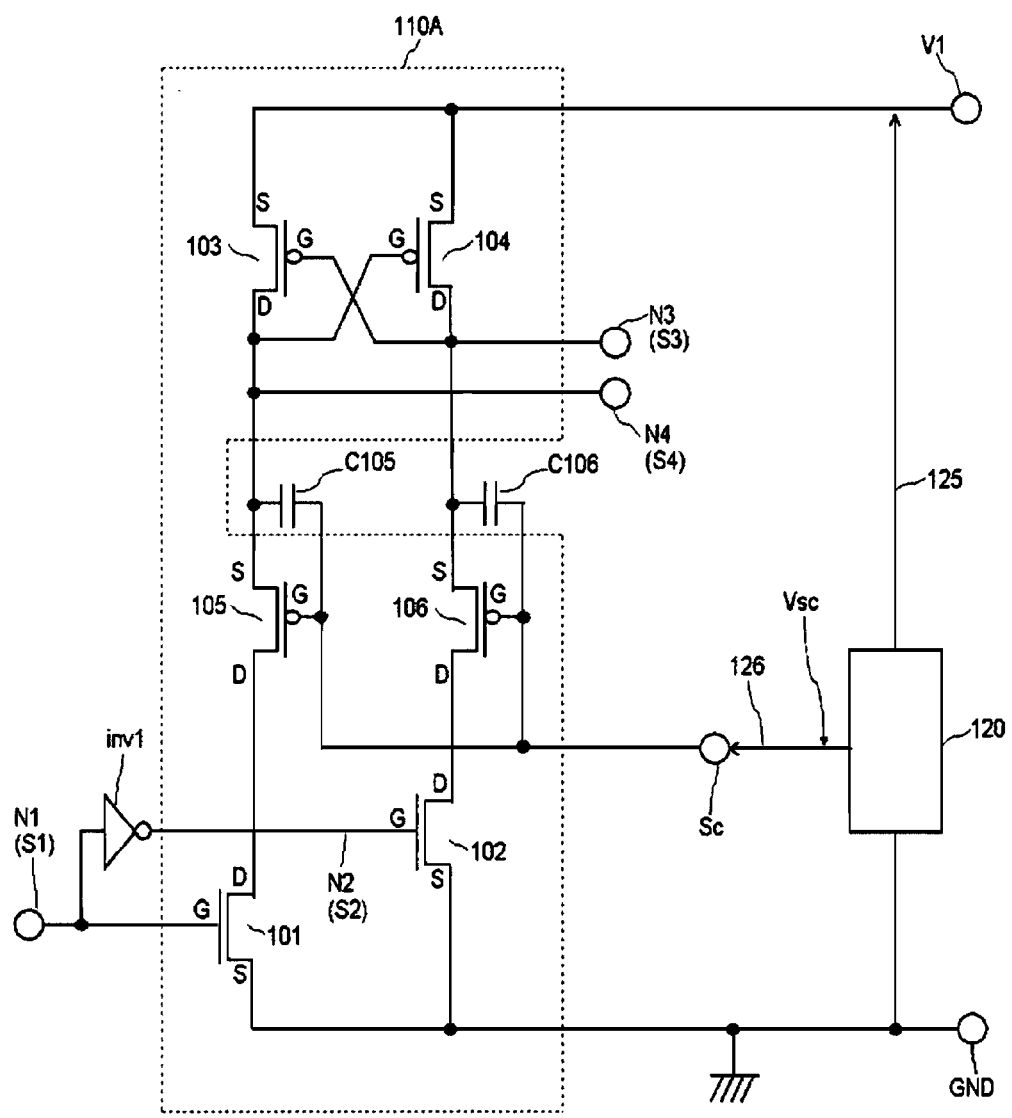
FIG. 5 is a view showing another modification of the level shift circuit according to the first embodiment.

FIG. 5 is a view showing another modification of the level shift circuit according to the first embodiment. FIG. 5 is related to a fifth embodiment of the present disclosure. The circuit configuration of FIG. 5 is basically the same as that of the first embodiment illustrated in FIG. 1. Namely, the level shift circuit 100 includes the first signal amplifying unit 110A and the level shift voltage generation circuit 120. The first signal amplifying unit 110A includes the pair of input transistors 101 and 102. In addition, the first signal amplifying unit 110A includes the pair of load transistors 103 and 104. Also, the first signal amplifying unit 110A includes the pair of level shift transistors 105 and 106. Further, the input signal S1 is input to the input port N1, and output signals S3 and S4 are output from the nodes N3 and N4, respectively. Such a configuration is the same as that of the first embodiment.

The configuration of FIG. 5 is different from that of FIG. 1, in that capacitors C105 and C106 are connected between the source S and gate G of each of the pair of level shift transistors 105 and 106. With this configuration, even if a noise component is included in the level shift voltage Vsc input to the level shift input port Sc, the noise component is decreased by the capacitors C105 and C106. Also, the level shift voltage Vsc input to the gates G of the level shift transistors 105 and 106 can be quickly transferred to the sources S of the level shift transistors 105 and 106, respectively. Of course, the circuit configuration illustrated in FIG. 5 and those illustrated in FIGS. 2 to 4 may be combined.

(Sixth Embodiment)

Figure 6:
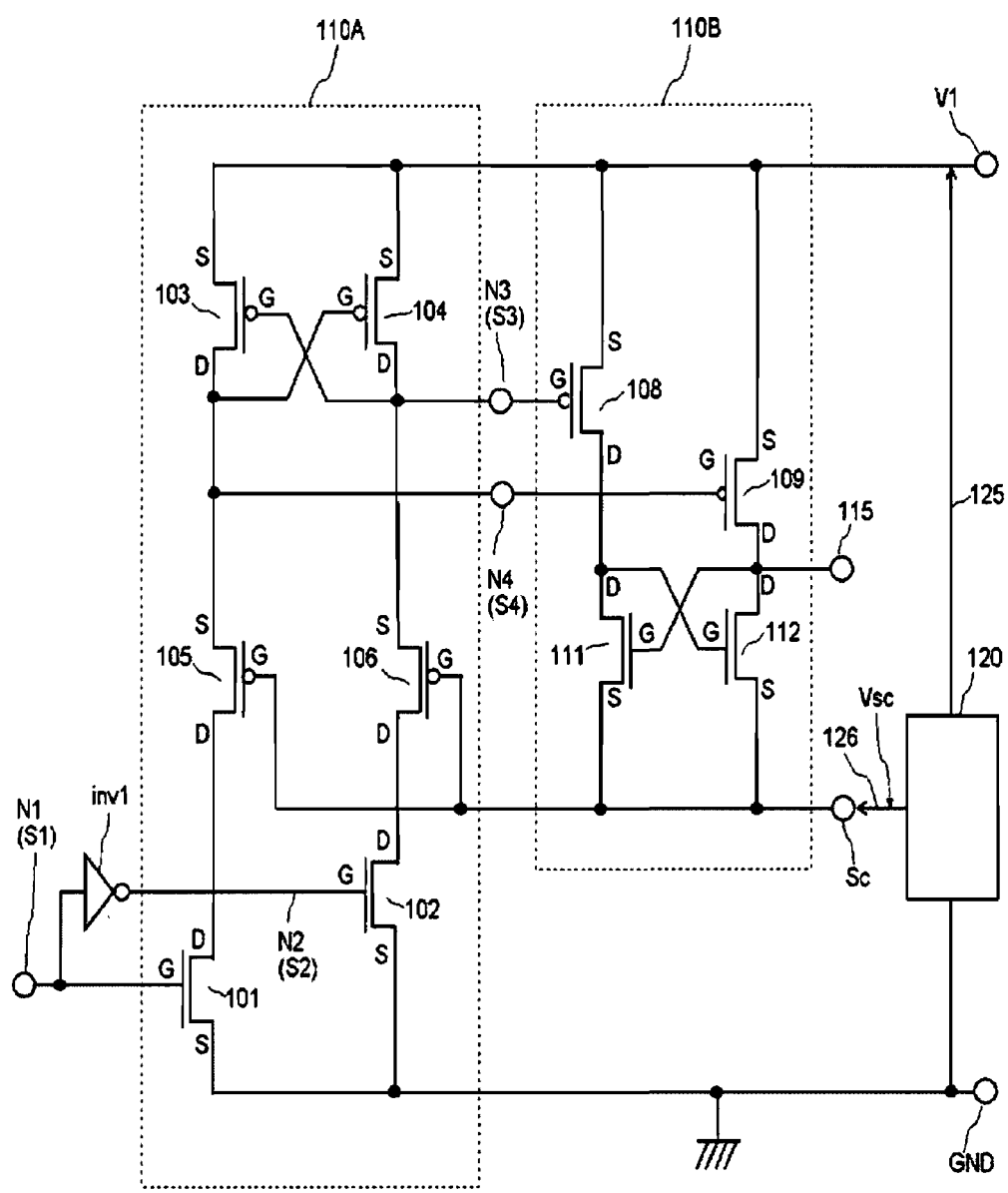
FIG. 6 is a circuit diagram showing a level shift circuit according to a second embodiment of the present disclosure.

FIG. 6 is a circuit diagram showing a level shift circuit according to a second embodiment of the present disclosure. FIG. 6 is related to a sixth embodiment of the present disclosure. An aspect of the sixth embodiment is different from that of the first to fifth embodiments. In other words, in the first to fifth embodiments, the level shift unit 122 is added to the first signal amplifying unit 110A, the constant voltage circuits 123 and 124 are added thereto, the capacitors C103 and C104 are added thereto, or the capacitors C105 and C106 are added thereto. In any case, they are connected to the pair of input transistors 101 and 102, the pair of load transistors 103 and 104, and the pair of level shift transistors 105 and 106 constituting the first level shift circuit 110.

In comparison, in the sixth embodiment, a second signal amplifying unit 110B including a transistor 108 (seventh transistor), 109 (eighth transistor), 111 (ninth transistor), and 112 (tenth transistor) is installed in addition to the first amplifying unit 110A, and this is different from the first to fifth embodiments. The transistors 108 and 109 are configured as p channel type MOS transistors, and transistors 111 and 112 are configured as n channel type MOS transistors, respectively. Respective drains D and respective gates G of the transistors 111 and 112 are commonly connected. Namely, a circuit connection of the transistors 111 and 112 is the same as that of the transistors 103 and 104 and forms a pair of cross-link transistors. Sources of the transistors 111 and 112 are commonly connected to the level shift input port Sc. The second signal amplifying unit 110B is prepared to reverse the polarity of the output signals S3 and S4 output to the nodes N3 and N4 of the first signal amplifying unit 110A, or shift the output signals S3 and S4, which have been level-shifted in the first signal amplifying unit 110A, to have a different level. In particular, the low level of the output signals S3 and S4 output to the nodes N3 and N4 is significantly higher than 0 potential, so the circuit at a next stage may not be directly connected to the first signal amplifying unit 110A. The reason is because the circuit at the next stage cannot be set to have a completely high level or low level. Thus, the second signal amplifying unit 110B is prepared to adjust the signal levels or polarities in order to match circuit operating points of the first signal amplifying unit 110A and the circuit at the next stage. An output signal which has been level-shifted in the first and second signal amplifying units 110A and 110B are output to an output port 115.

As mentioned above, a DC potential of the nodes N3 and N4, at which the output signals S3 and S4 are output from the first signal amplifying unit 110A is increased or decreased in the same direction with an increase or decrease in the supply voltage V1. A signal operated depending on the first signal amplifying unit 110A is input to the second signal amplifying unit 110B. Thus, as for the potential at the sources of the transistors 111 and 112, a voltage, which is changed depending on the increase or decrease of the supply voltage V1, is supplied, whereby the voltage applied to the transistors 108 to 112 cannot be changed in spite of an increase or decrease in the supply voltage V1 applied to the second signal amplifying unit 110B.

Also, in the sixth embodiment illustrated in FIG. 6, the level shift circuit 100 includes the level shift voltage generation circuit 120. One of two voltages generated by the level shift voltage generation circuit 120 is supplied to the supply voltage V1 through the voltage supply line 125 and the other, i.e., the level shift voltage Vsc is supplied to the first signal amplifying unit 110A and the second signal amplifying unit 110B through the voltage supply line 126 and the level shift input port Sc. Accordingly, a circuit operating point of the second signal amplifying unit 110B, as well as the first signal amplifying unit 110A, is controlled by the level shift voltage generation circuit 120.

(Seventh Embodiment)

Figure 7:
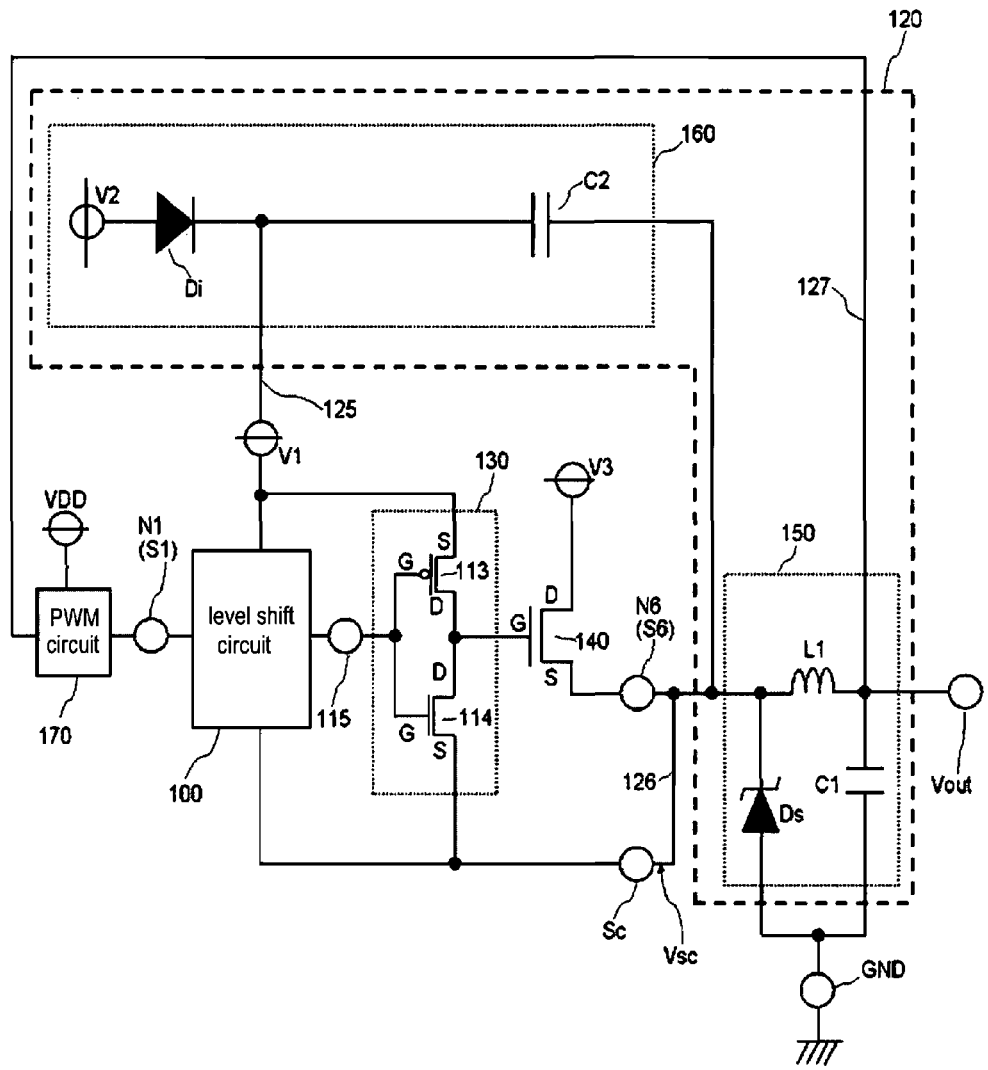
FIG. 7 is a block diagram in which the level shift circuit according to the present disclosure is applied to a switching regulator.

FIG. 7 schematically shows an example of using the level shift circuit 100 according to the present disclosure in an asynchronous step-down switching regulator having a bootstrap circuit.

The step-down switching regulator 200 includes a level shift circuit 100, a level shift voltage generation circuit 120, a driver circuit 130, a switching transistor 140, and a PWM circuit 170. Meanwhile, the level shift voltage generation circuit 120 includes a smoothing circuit 150 and a bootstrap circuit 160. The level shift voltage generation circuit 120 is equivalent to the level shift voltage generation circuits illustrated in FIGS. 1 to 6.

In FIG. 7, the level shift circuit 100 is shown as a block box in terms of the purpose of drawing a figure. The level shift circuit 100 may include, for example, the first signal amplifying unit 110A and the second signal amplifying unit 110B as shown in FIG. 6. The first signal amplifying unit 110A illustrated in FIG. 6 is the same as those illustrated in FIGS. 1 to 5, and includes the input port N1, the output port 115, and the supply voltage V1. For example, a PWM signal whose pulse width is changed over time is input as the input signal S1 to the input port N1 from the PWM circuit 170. The PWM signal, which has been input to the input port N1, is converted to have a prescribed DC level and then output to the output port 115. The level shift circuit 100 may amplify the PWM signal to have a prescribed size, as well as converting the DC level. In one embodiment of the present disclosure, the supply voltage V1 is not a fixed DC voltage but a voltage operating depending on an external voltage supply. In other words, the supply voltage V1 is generated from the level shift voltage generation circuit 120. The level shift voltage generation circuit 120 includes the bootstrap circuit 160 and the smoothing circuit 150. Thus, the size of the supply voltage V1 is proportional to supply voltages V2 and V3. The supply voltage V2 is supplied to the bootstrap circuit 160, and the supply voltage V3 is supplied to the switching transistor 140. The size of the supply voltage V1 depends on the size of the supply voltages V2 and V3. In other words, the size of the supply voltage V1 is controlled by the size of the supply voltages V2 and V3. In one embodiment of the present disclosure, the supply voltages V1, V2, and V3 are 4.3V, 5V, and 20V, respectively.

The driver circuit 130 is prepared to drive the switching transistor 140 depending on a signal which has been level-adjusted by the level shift circuit 100 installed at a front stage thereof. In other words, the driver circuit 130 is prepared as a driver of the switching transistor 140, and is configured as a so-called CMOS inverter in which transistors 113 and 114 are connected in series. The transistor 113 is a p channel type MOS transistor, and the transistor 114 is an n channel type MOS transistor. A low potential side, i.e., a source S, of the transistor 114 is connected to the level shift input port Sc. The level shift input port Sc is connected to a switching output port N6 by a voltage supply line 126, so the output level of the driver circuit 130 operates depending on a signal level supplied to the level shift input port Sc.

The switching transistor 140 is configured as, for example, an n channel type MOS transistor, and generates a prescribed DC voltage for driving the smoothing circuit 150. A supply voltage V3 is input to a drain D, which is a first main electrode of the switching transistor 140, and an output signal from the driver circuit 130 is input to a gate G, which is a control electrode of the switching transistor 140, respectively. The size of the supply voltage V3 is selected as, for example, 20V. A source S, which is a second main electrode, is connected to the smoothing circuit 150 through a switching output port N6 interposed therebetween. The smoothing circuit 150 is connected to the switching output port N6 to output a switching signal S6. A maximum value of the switching signal S6 is 20V which is substantially equal to the size of the supply voltage V3, and a minimum value thereof is almost 0V. A current is supplied to an inductor L1 depending on the switching signal S6, and an output voltage Vout is output from a common connection point of the inductor L1 and a smoothing capacitor C1. Meanwhile, as the switching transistor 140, an NPN type bipolar transistor, instead of the n channel type MOS transistor, may be used. In this case, the first main electrode, the second main electrode, and the control electrode are equivalent to a collector, an emitter, and a base, respectively. Also, instead of the n channel type MOS transistor, a p channel type MOS transistor or a PNP type bipolar transistor may be used. When a p channel type MOS transistor is used, the first main electrode, the second main electrode, and the control electrode are equivalent to a source, a drain, and a gate, respectively. Also, when a PNP type bipolar transistor is used, the first main electrode, the second main electrode, and the control electrode are equivalent to an emitter, a collector, and a base, respectively.

In the present disclosure, the smoothing circuit 150 is positioned as one component of the level shift voltage generation circuit 120, and includes the inductor L1, a flywheel diode Ds, and the smoothing capacitor C1. When the switching signal S6 output to the switching output port N6 has a high level, namely, when the switching transistor 140 is in an ON state, a current is supplied to the inductor L1 to accumulate energy therein. At this time, the flywheel diode Ds is placed in a reverse directional state, so a current does not flow to the flywheel diode Ds. Even when the switching transistor 140 is changed into an OFF state, the switching transistor 140 is not immediately turned off and the current keeps flowing thereto, in terms of the electrical characteristics of the inductor L1. Thus, the current is supplied from the reference potential GND side to the inductor L1 through the flywheel diode Ds interposed therebetween. At this time, the flywheel diode Ds is biased in a forward direction. As the flywheel diode Ds, generally, a Schottky barrier diode is often used. The reason is because a forward voltage of the Schottky barrier diode ranges from 0.2V to 0.3V, lower than 0.6 to 0.7 of a silicon diode, which leads to a reduction in power consumption. Also, when the Schottky barrier diode is changed from an ON state to an OFF state or from an OFF state to an ON state, reverse recovery charges are small, and a so-called recovery time becomes fast. Meanwhile, the flywheel diode D2 is not prepared as an individual component but may be simultaneously put into the level shift circuit 100, the driver circuit 130, or the switching transistor 140 side so as to be an integrated semiconductor. The smoothing capacitor C1 is prepared to restrain a so-called ripple component so that the switching signal S6 output to the output port Vout may not be greatly varied within a short time.

FIG. 7 shows the asynchronous switching regulator which uses the flywheel diode Ds. However, in the case of a synchronous switching regulator, a transistor may be used instead of the flywheel diode Ds.

In the present disclosure, the bootstrap circuit 160 is positioned as one component of the level shift voltage generation circuit 120, along with the smoothing circuit 150. The bootstrap circuit 160 includes the diode element Di, the capacitor C2, the supply voltage V2, and the switching output port N6.

In the bootstrap circuit 160, the supply voltage V2 is supplied to the anode of the diode element Di, the cathode of the diode element Di is connected to the first electrode of the capacitor C2, the second electrode of the capacitor C2 is connected to the switching output port N6, and the level shift voltage Vsc is supplied from the level shift input port Sc to the switching output port N6 through the voltage supply line 126. A power supply voltage for driving the level shift circuit 100 is supplied to the supply voltage V1 from the common connection point of the cathode of the diode element Di and the first electrode of the capacitor C2.

The switching signal S6 for generating the level shift voltage Vsc is output to the switching output port N6. The bootstrap circuit 160 generates the supply voltage V1, which operates depending on the size of the switching signal S6. A maximum amplitude value of the switching signal S6 is substantially equal to the supply voltage V3 supplied to the drain D of the switching transistor 140. Thus, the supply voltage V1 is generated based on the supply voltage V3 and the supply voltage V2.

The supply voltage generated by the bootstrap circuit 160 is the supply voltage V1 at the common connection point of the diode element Di and the capacitor C2. The supply voltage V1 is used as a power supply voltage for driving the level shift circuit 100. Meanwhile, the diode element Di is not necessarily a diode itself but may be configured as a MOS transistor or a bipolar transistor to perform a circuit operation equivalent to diode characteristics. Namely, it is required that the capacitor C2 is charged from the supply voltage V2 through the diode element Di. In other words, it may be a diode element which can control the direction of current flowing from a first main electrode (or a second main electrode) to a second main electrode (or a first main electrode) of a transistor (not shown).

When the switching transistor 140 is in an OFF state, the capacitor C2 is charged from the supply voltage V2 through the diode element Di. Here, when a forward voltage of the diode element Di is Vd, the supply voltage V1 is V1=V2−Vd. Also, when the switching transistor 140 is in an ON state, if the switching signal of the switching output port N6 is S6, the supply voltage V1 is V1=S6+(V2−Vd). Meanwhile, when the switching transistor 140 is in an ON state, a voltage of the switching signal S6 is substantially equal to the supply voltage V3, so the supply voltage V1 may be expressed to be V1=V3+(V2−Vd). Accordingly, if the forward voltage of the diode element Di is sufficiently higher than Vd, the supply voltage V2 is V1 when the switching transistor 140 is in an OFF state, and the supply voltage V1 is V3+V2 when the switching transistor 140 is in an ON state. Also, since the supply voltage V1 supplied to the driver circuit 130 can be controlled to be higher than the supply voltage V3 of the switching transistor 140, the switching transistor 140 can be sufficiently driven.

The interior of the PWM circuit 170 is not illustrated, but a so-called PWM signal, whose pulse width is changed over time, is generated therein. The supply voltage VDD is supplied to the PWM circuit 170. The size of the supply voltage VDD is selected as, for example, 5V. For example, an error amplifier (not shown) is prepared in the PWM circuit 170, and a feedback voltage is fed back to the error amplifier from the output Vout through the voltage supply line 127. A reference voltage (not shown) is prepared in the error amplifier, and the size of the output voltage Vout is controlled based on the reference voltage in the error amplifier. The PWM signal output from the PWM circuit 170 is input to the input port N1. The PWM signal is supplied to the level shift circuit 100 through the input port N1. Meanwhile, a PFM (Pulse Frequency Modulation) circuit, whose frequency is changed over time, may be used instead of the PWM circuit 170.

In the switching regulator 200 illustrated in FIG. 7, the switching output port N6 and the level shift input port Sc are commonly connected by the voltage supply line 126, and the circuit operating point of the level shift circuit 100 is forcibly set depending on the switching signal S6 output to the switching output port N6. If there is a deviation from the present disclosure, the voltage supply line 126 is not installed and the potential of the level shift input port Sc is separated from the potential of the switching output port N6. In this case, control may be made to a certain degree. However, it cannot be expected to faithfully execute controlling of the circuit operation of the level shift circuit 100.

The supply voltage V3 is supplied to the first main electrode, i.e., the drain D of the switching transistor 140, which is driven by the driver circuit 130 connected to the supply voltage V1. The driver circuit 130 is driven by the second signal amplifying unit 110B connected to the supply voltage V1, and the second signal amplifying unit 110B is driven by the first signal amplifying unit 110A driven by the supply voltage V1.

According to the foregoing circuit configuration, the size of the supply voltage V3 supplied to the drain D, which is the first main electrode, of the switching transistor 140 is almost reflected in the switching signal S6 output to the switching output port N6. The switching signal S6 is supplied to the first signal amplifying unit 110A and the second signal amplifying unit 110B through the voltage supply line 126 and the level shift input port Sc.

(Eighth Embodiment)

Figure 8:
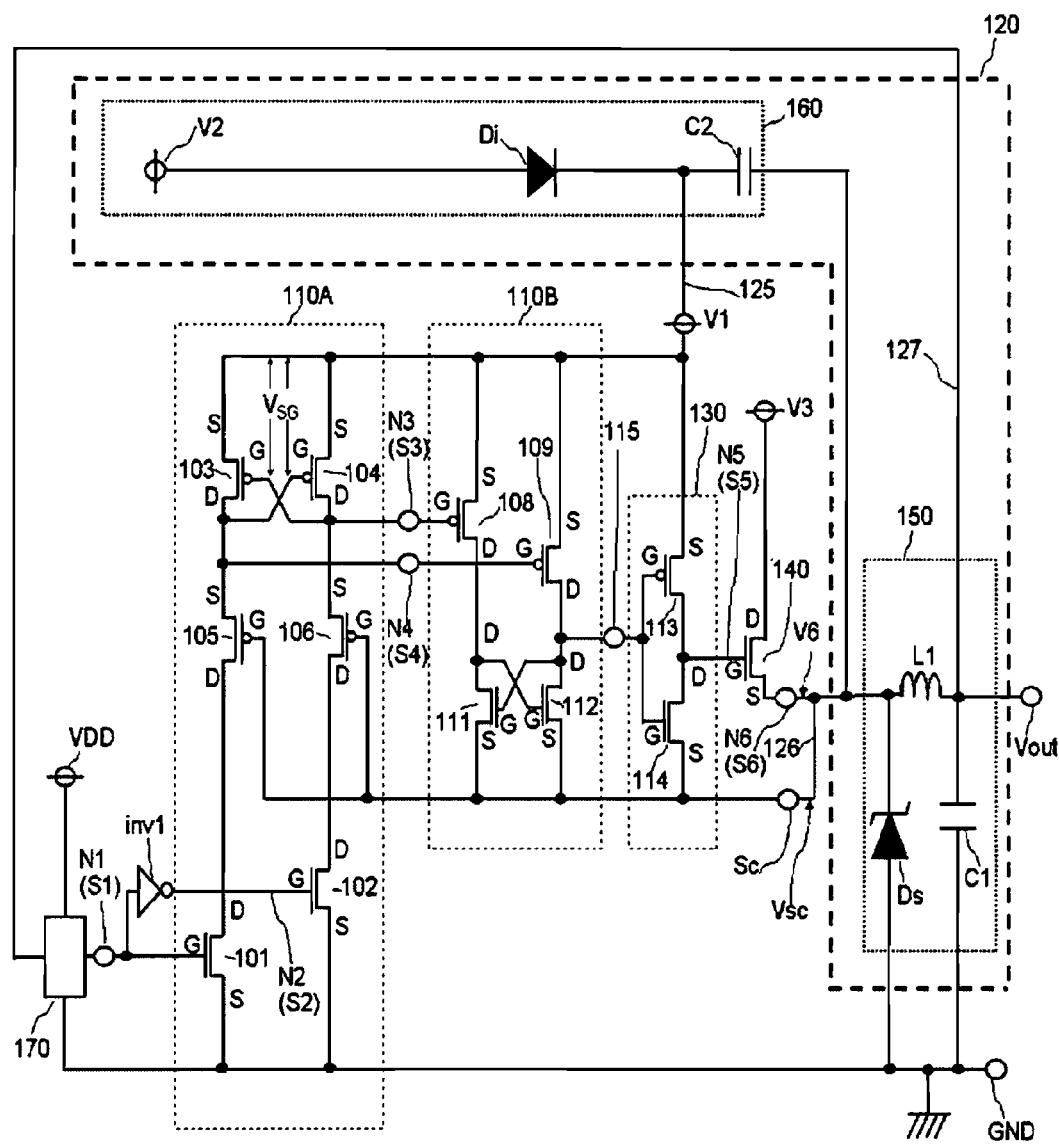
FIG. 8 is a detailed circuit diagram in which the level shift circuit according to the present disclosure is applied to the switching regulator.

FIG. 8 shows a switching regulator 200 according to an eighth embodiment, which illustrates a detailed circuit configuration of the seventh embodiment shown in FIG. 7. The switching regulator 200 includes the first signal amplifying unit 110A, the second signal amplifying unit 110B, the level shift voltage generation circuit 120, the driver circuit 130, the switching transistor 140, and the PWM circuit 170. The level shift voltage generation circuit 120 includes the smoothing circuit 150 and the bootstrap circuit 160.

The first signal amplifying unit 110A illustrated in FIG. 8 is the same as those illustrated in FIGS. 1 to 6, so a description of a circuit configuration and a circuit operation thereof will be omitted.

Also, the second signal amplifying unit 110B is the same as that illustrated in FIG. 6, so a description of a circuit configuration and a circuit operation thereof will be omitted.

The driver circuit 130, the switching transistor 140, the smoothing circuit 150, the bootstrap circuit 160, and the PWM circuit 170 are the same as those illustrated in FIG. 7, so a description of a circuit configuration and a circuit operation thereof will be omitted.

Also, the source S, which is the second main electrode, of the switching transistor 140, namely, the switching output port N6, and the level shift input port Sc prepared to control the circuit operating point of the first signal amplifying unit 110A and the second signal amplifying unit 110B are connected to the voltage supply line 126.

Figure 9:
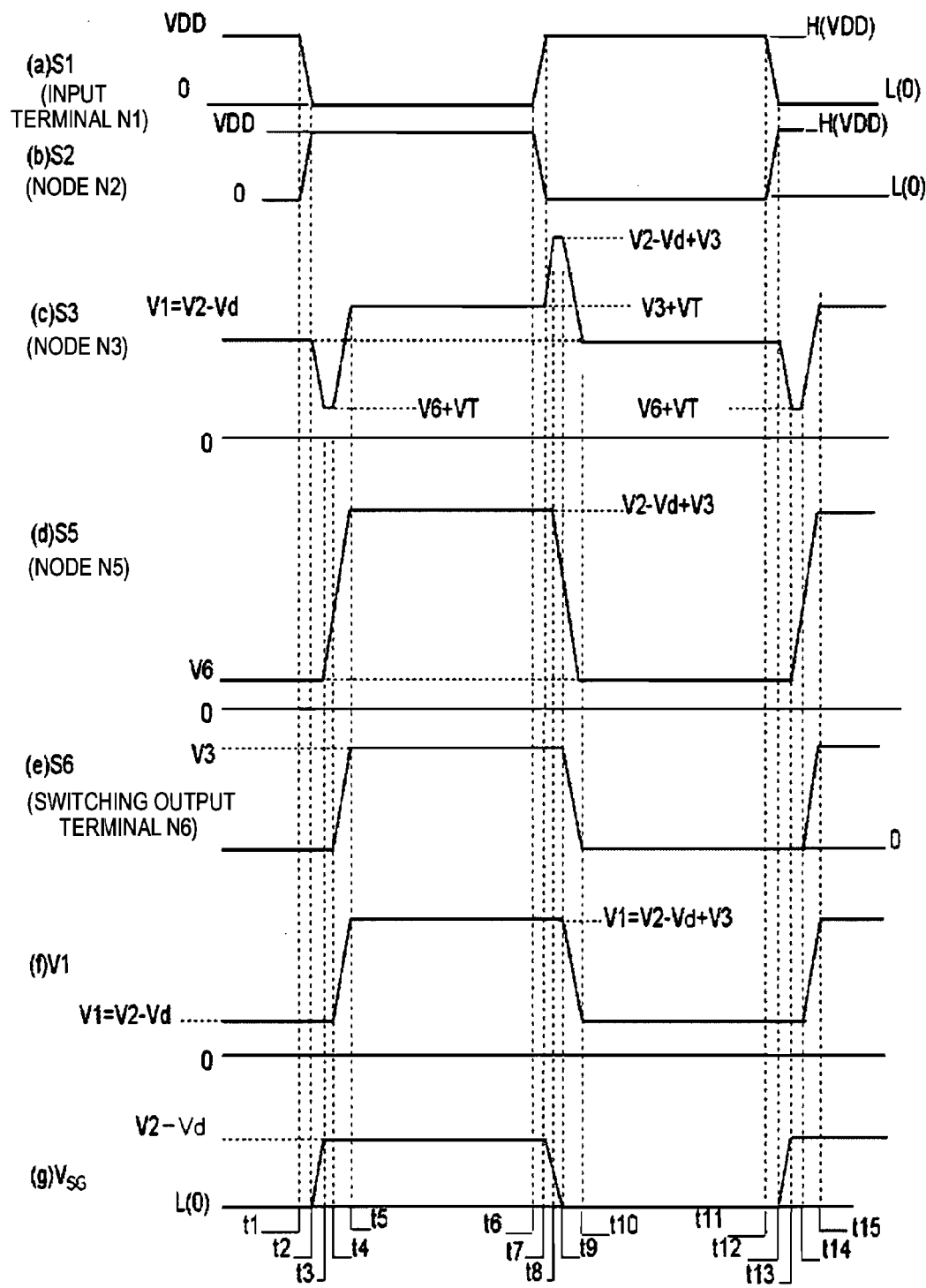
FIG. 9 is a view showing timing charts of major nodes in FIG. 8 in which the level shift circuit according to the present disclosure is applied to the switching regulator.
Figure 10:
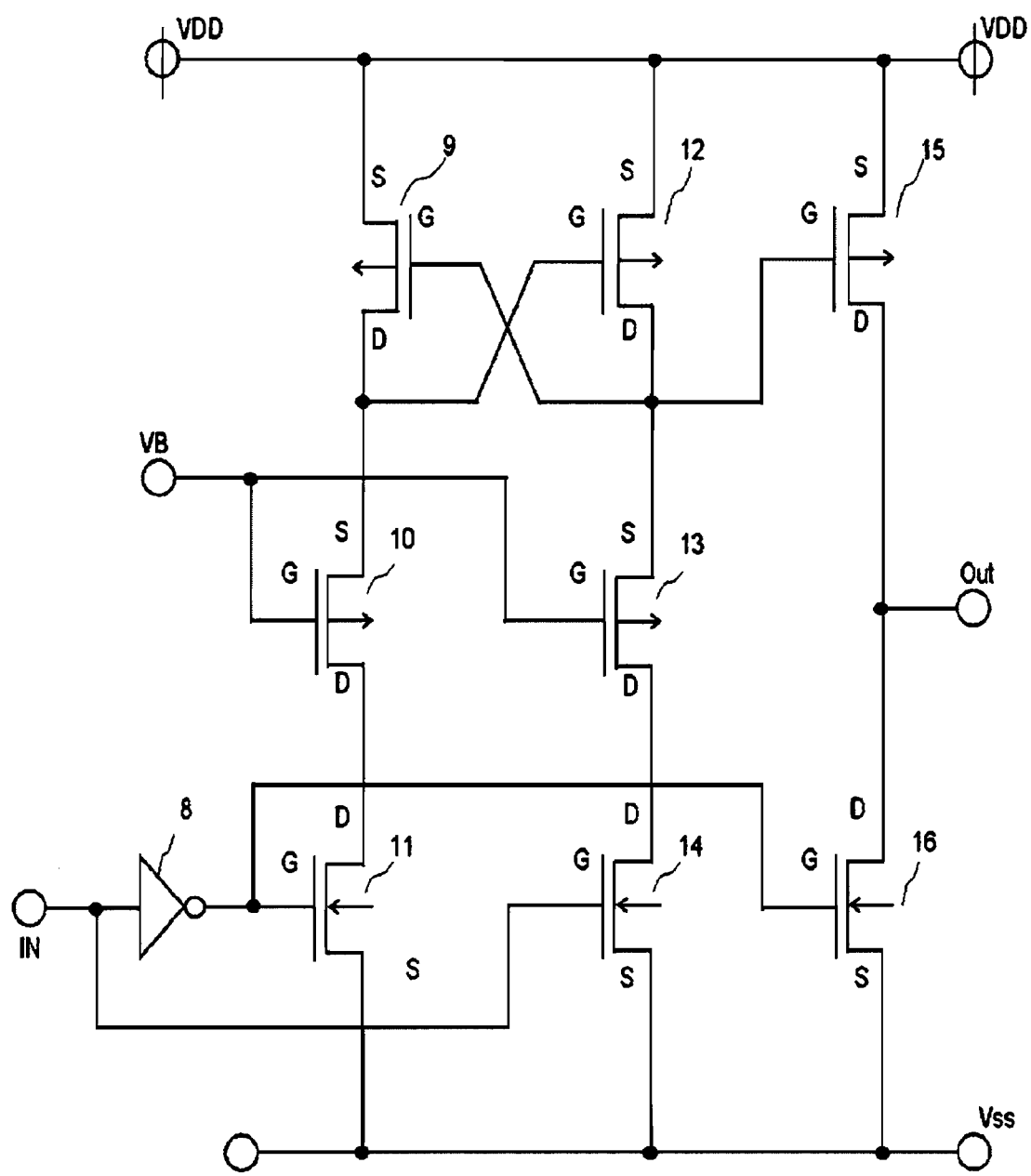
FIG. 10 is a view showing an example of a conventional level shift circuit.
Figure 11:
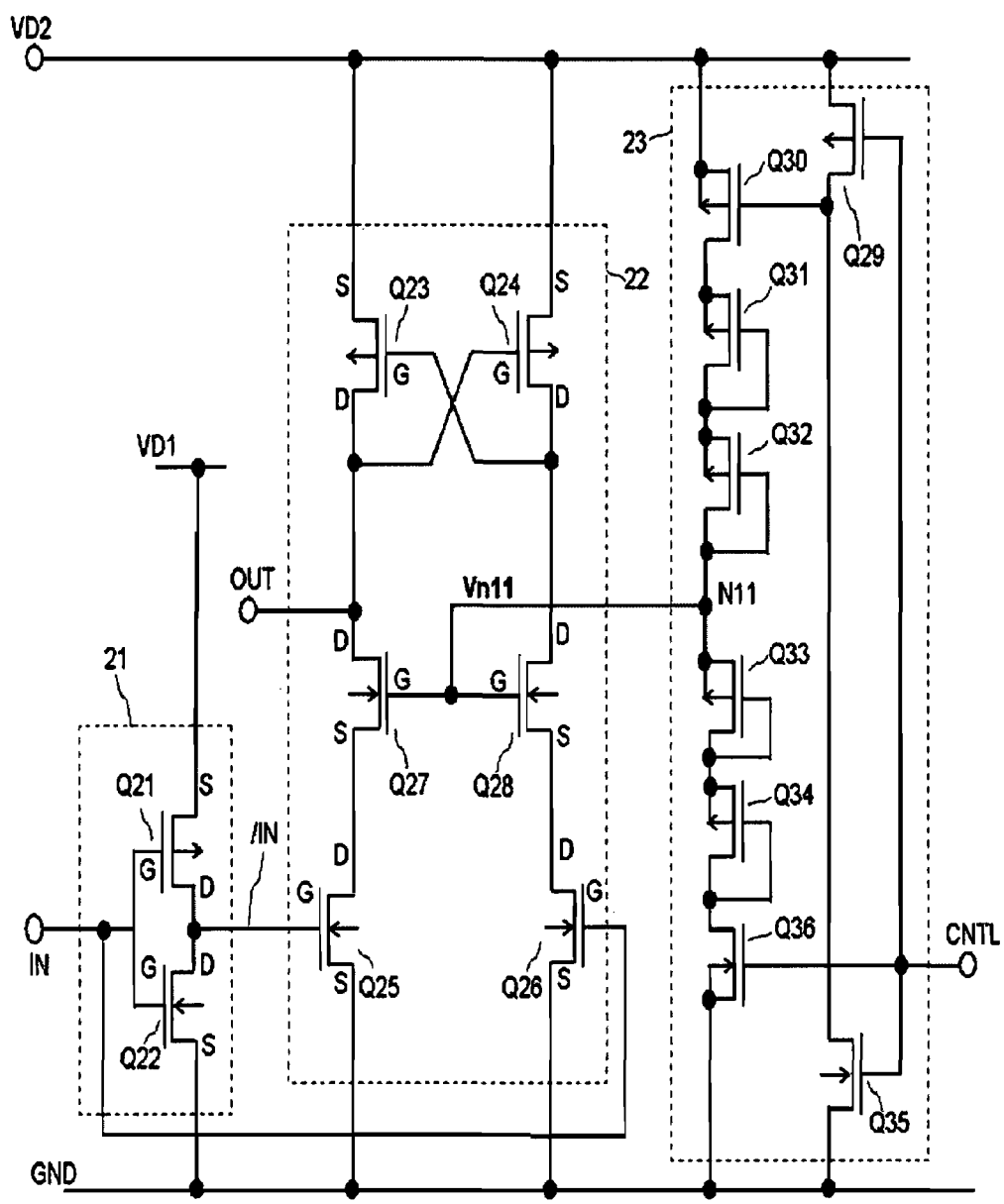
FIG. 11 is a view showing another example of a conventional level shift circuit.

FIG. 9 illustrates timing charts at major nodes of the switching regulator 200 illustrated in FIG. 8. The input signal S1 illustrated in FIG. 9(a) schematically shows the PWM signal input to the input port N1, namely, the gate G of the input transistor 101. In actuality, the input signal S1 is a so-called PWM signal whose pulse width is changed over time, but the PWM signal whose duty ratio is 50% is shown for the convenience of drawing a figure and explanation. The input signal S1 is changed from a high level H to a low level L during a period of time t1 to time t2, and is maintained at a low level during a period of time t2 to time t6. When the input signal S1 is changed from the low level L to the high level H during the period of time t6 to time t7, it is maintained at the high level H until time t11. During the period of time t11 to time t12, the input signal S1 is changed from the high level H to the low level L, and is maintained at the low level even after time t15.

The input signal S2 illustrated in FIG. 9(b) schematically shows a PWM signal input to the node N2, namely, the input transistor 102. In actuality, like the input signal S1, the input signal S2 is a so-called PWM signal whose pulse width is changed over time. The input signal S2 is substantially the same as a signal obtained by reversing the polarity of the input signal S1 in the inverter inv1, and a signal level at each time is completely opposite to that of the input signal S1, so a description thereof will be omitted.

FIG. 9(c) shows an output signal S3 output to the node N3, namely, the common connection point of the gate G of the load transistor 103 and the drain D of the load transistor 104. The output signal S3 operates depending on the size of a threshold voltage VT of the input transistor 102 and the input signal S2 input to the gate G. In other words, during the period until the time t1, in which the input signal S2 has a low level L(0), the input transistor 102 is turned off, so the level of the output signal S3 is equal to the supply voltage V1, and the supply voltage V1 is obtained as a level lowered by the forward voltage Vd of the diode element Di from the supply voltage V2 (V1=V2−Vd). At time t2, the input transistor 102 starts to be turned on, so the potential of the node N3 starts to be dropped to the potential (V6+VT), and the potential (V6+VT) is maintained as a substantially constant value during the period from time t3 to time t4. Meanwhile, the voltage V6 is a potential of a maximum value of the switching signal S6 output to the switching output port N6, and the threshold voltage VT is a threshold voltage of the level shift transistor 106.

In FIG. 9(c), the output signal S3 follows the switching signal S6 generated from the switching output port N6 and increases from time t4 until time t5. When the size of the potential reaches (V3+VT), it is maintained as a substantially constant value. The potential of the output signal S3 is maintained as a substantially constant value during time t5 to time t7, but it increases from time t7 to time t8 and is maintained as a potential (V2−Vd+V3)=(V1+V3) during time t8 to time t9. At time t9, the transistor 104 has been turned on and the potential of the node N3 starts decrease and the potential level of the output signal S3 is maintained as V1=(V2−Vd), which is the initial potential level, from time t10 to time t11.

The change in the potential of the output signal S3 operates depending on the input signal S2 input to the node N2, and shows the same behavior as that in the period from time t1 to time t5 even during the period from time t11 to time t15.

Also, the output signal S4 output to the node N4 operates depending on the input signal S1 input to the input port N1. The input signal S1 has a polarity that is opposite of the input signal S2, so the output signal S4 is a reverse signal of the output signal S3 illustrated in FIG. 9(c) and thus its illustration is omitted.

FIG. 9(d) shows the drive signal S5 appearing at the node N5, namely, the gate G of the switching transistor 140. A signal level of the drive signal S5 is changed between the supply voltage V1 and the size of the voltage of the level shift input port Sc. Since the level shift input port Sc is commonly connected to the switching output port N6, it is eventually affected by the switching signal S6.

Also, the drive signal S5 is affected by the output signal S3 output to the node N3. When time t3 arrives at which the output signal S3 has a low level, the drive signal S5 starts to gradually increase. This is because, when the node N3 has a low level, the transistors 108 and 112 are turned on to make the output port 115 have a low level, turn on the transistor 113, and make the gate G of the switching transistor 140 have a high level. The drive output signal S5 is increased up to the potential (V2−Vd+V3) and is reduced depending on a reduction in the output signal S3, and the reduced level is substantially equal to the potential of the level shift input port Sc, namely, the potential of the switching output port N6.

FIG. 9(e) shows the switching signal S6 output to the switching output port N6. The switching signal S6 operates depending on the drive signal S5. The switching signal S6 is output to the second main electrode, i.e., the source S, of the switching transistor 140, and a maximum value of the amplitude thereof is equal to the supply voltage V3 supplied to the first main electrode, i.e., the drain. Meanwhile, the switching transistor 140 is turned on when the size of the drive signal S5 exceeds the threshold voltage VT, so a rising timing and a decreasing timing of the switching signal S6 are slightly delayed from those of the drive signal S5. In other words, the drive signal S5 rises at time t3, but the switching signal S6 rises at time t4, which comes later than time t3. Also, the drive signal S5 is decreased at time t8, but the switching signal S6 is decreased at time t9 which is later than t8. In other words, it suggests that, as for the drive signal S5, the threshold voltage VT required for the switching transistor 140 to be turned on or off is changed between time t3 and time t4 and between time t8 and time t9.

FIG. 9(f) shows the supply voltage V1. The supply voltage V1 is a voltage generated from the bootstrap circuit 160, and used as a voltage supply of the first signal amplifying unit 110A and the second signal amplifying unit 110B. Namely, the supply voltage V1 is dependent upon the supply voltage V2 and the supply voltage V3. In other words, the supply voltage V1 operates depending on an ON/OFF operation of the switching transistor 140. The size of the supply voltage V1 when the switching transistor 140 is turned off is different from the size of the supply voltage V1 when the switching transistor 140 is turned on. The switching transistor 140 is turned off from time t1 to time t4, and at this time period, the supply voltage V1 is determined by the supply voltage V2 and the forward voltage Vd of the diode element Di, i.e., V1=(V2−Vd). During time t4 to time t5, the switching transistor 140 starts to be gradually turned on. The switching transistor 140 is in an ON state during the period of time t5 to time t9. During this period, the bootstrap circuit 160 operates, so the potential is increased up to (V2−Vd+V3). The potential (V2−Vd+V3) is gradually reduced during the period of time t9 to time t10, and when time t10 arrives, the potential is (V2−Vd). Thereafter, the size of the potential (V2−Vd) is maintained until time t14, and during the period of time t14 to time t15, the supply voltage V1 starts to increase toward the potential (V2−Vd+V3).

FIG. 9(g) shows the voltage $V_{SG}$ applied between the source S and the gate G of the load transistor 103 illustrated in FIG. 8. The voltage $V_{SG}$ is also equal to the voltage applied between the source S and the gate G of the load transistor 104. Also, the voltage $V_{SG}$ is equal to the voltage applied between the source S and the gate G of each of the load transistors 103 and 104 and equal to the voltage applied between the source S and the drain D of each load transistor. The reason is because, the respective gates G of the load transistors 103 and 104 are connected to the respective drains D of the load transistors 104 and 103, and the potential of both drains D are substantially the same.

The size of the voltage $V_{SG}$ illustrated in FIG. 9(g), which is the voltage applied between the source S and the gate G of the load transistor 103 illustrated in FIG. 8 is related to the withstand voltage of the load transistors 103 and 104, and is within the range from 0 volts to the voltage (V2−Vd). In other words, it is noted that the influence of the supply voltage V3 having the highest voltage level is completely removed. When the size of the supply voltage V2 is selected to be 5V or so, even if the supply voltage V3 of the switching transistor 140 is set to be high and the supply voltage V1 supplied to the first signal amplifying unit 110A, the second signal amplifying unit 110B, and the driver circuit 130 is used as a high voltage, the size of the voltage $V_{SG}$ applied to the load transistors 103 and 104 can be restrained to be within a maximum 5V, so a low withstand voltage of the load transistors 103 and 104 can be realized.

The level shift circuit according to the present disclosure can correspond to relatively extensive voltage sources from a low voltage (e.g., 3V~5V) to a high voltage (e.g., 10V~100V), so its industrial availability is high. Also, since the level shift circuit according to the present disclosure can be driven by a low power supply voltage (e.g., 3V~5V) irrespective of the size of the power supply voltage used at the switching regulator side, when it is configured as a semiconductor integrated circuit, a high density and compact size can be accomplished. In addition, the switching regulator including such a level shift circuit can be reduced in size, its industrial availability is very high.

In the level shift circuit according to the present disclosure, the first supply voltage supplied to the signal amplifying unit and the circuit operating point of the signal amplifying unit are determined by the level shift voltage generation circuit operating as the second supply voltage different from the first supply voltage supplied to the signal amplifying unit, so a prescribed size can be maintained between the first supply voltage and the circuit operating point of the signal amplifying unit irrespective of the first supply voltage. Accordingly, a low withstand voltage of the transistor constituting the first signal amplifying unit 110A can be achieved, and the circuit operating point can be optimized.

Also, since the level shift voltage generation circuit according to the present disclosure can be configured as a very simple circuit comprised of the diode element Di and the capacitor C2, the overall configuration of the level shift circuit can be reduced in size.

Moreover, in the switching regulator according to the present disclosure, the level shift circuit operating depending on the supply voltage and the level shift voltage generated from the bootstrap circuit is prepared, and the switching transistor is driven based on an output signal from the level shift circuit, whereby the circuit operating points of the level shift circuit and the switching transistor can be precisely adjusted.

While certain embodiments have been described, these embodiments have been presented by way of example only, and are not intended to limit the scope of the inventions. Indeed, the novel core holding structure and printer described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A level shift circuit, comprising:
an input port configured to receive an input signal;
a first signal amplifying unit configured to amplify the received input signal;
a node at the first signal amplifying unit to output the amplified signal;
a level shift input port configured to receive a level shift voltage for controlling a DC level of the node;
a first supply voltage configured to drive the first signal amplifying unit;
a level shift voltage generation circuit configured to generate the first supply voltage and the level shift voltage,
wherein the first signal amplifying unit comprises:
first conductive type first and second transistors connected between a reference potential and the first supply voltage, and disposed at the reference potential side to form a pair of differential transistors, the first and second transistors having the input port to receive the input signal:
second conductive type third and fourth transistors connected between the first supply voltage and the reference potential, disposed at the first supply voltage side to form a pair of cross-link transistors, the third and fourth transistors having the node form which the amplified signal is output; and
second conductive type fifth and sixth transistors electrically connected between the pair of differential transistors and the pair of cross-link transistors, the fifth and sixth transistors having the level shift input port to which the level shift voltage is applied,
wherein the amplified signal includes first and second output signals obtained by amplifying the input signal and the node include first and second output ports configured to output the first and second output signals, respectively;
a second signal amplifying unit including a seventh transistor to which the first output signal is input, an eighth transistor to which the second output signal is input, and ninth and tenth transistors connected to the seventh and eighth transistors so as to be cross-linked; and
an output port configured to output a level-shifted output signal from the ninth or tenth transistor side.

2. The level shift circuit of claim 1, wherein first main electrodes of the seventh and eighth transistors are commonly connected to the first supply voltage, the first and second output signals are input to control electrodes of the seventh and eighth transistors, respectively, second main electrodes of the seventh and eighth transistors are connected to first main electrodes of the ninth and tenth transistors, a control electrode of the ninth transistor and a second main electrode of the tenth transistor are commonly connected, a control electrode of the tenth transistor and a second main electrode of the ninth transistor are commonly connected, and the second main electrodes of the ninth and tenth transistors are commonly connected to the level shift input port.

3. The level shift circuit of claim 1, wherein the first conductive type and the second conductive type are N type and P type respectively.

4. The level shift circuit of claim 3, wherein the N type is an n channel MOS type and the P type is a p channel MOS type.

5. The level shift circuit of claim 3, wherein the N type is a bipolar NPN type and the P type is a bipolar PNP type.

6. The level shift circuit of claim 1, wherein the first and second transistors are N channel MOS transistors, and the third to sixth transistors are P channel MOS transistors.

7. The level shift circuit of claim 1, wherein the first and second transistors are bipolar NPN transistors, and the third to sixth transistors are bipolar PNP transistors.

8. A switching regulator, comprising:
a level shift circuit including an input port configured to receive an input signal, a first signal amplifying unit configured to amplify the received input signal, a node at the first signal amplifying unit to output the amplified signal, a level shift input port configured to receive a level shift voltage for controlling a DC level of the node, a first supply voltage configured to drive the first signal amplifying unit,
wherein the first signal amplifying unit comprises:
first conductive type first and second transistors connected between a reference potential and the first supply voltage, and disposed at the reference potential side to form a pair of differential transistors, the first and second transistors having the input port to receive the input signal;
second conductive type third and fourth transistors connected between the first supply voltage and the reference potential, disposed at the first supply voltage side to form a pair of cross-link transistors, the third and fourth transistors having the node from which the amplified signal is output; and
second conductive type fifth and sixth transistors electrically connected between the pair of differential transistors and the pair of cross-link transistors, the fifth and sixth transistors having the level shift input port to which the level shift voltage is applied,
wherein the amplified signal includes first and second output signals obtained by amplifying the input signal and the node include first and second output ports configured to output the first and second output signals, respectively, wherein the level shift circuit further includes:
a second signal amplifying unit including a seventh transistor to which the first output signal is input, an eighth transistor to which the second output signal is input, and ninth and tenth transistors connected to the seventh and eighth transistors so as to be cross-linked; and
an output port configured to output a level-shifted output signal from the ninth or tenth transistor side;

a bootstrap circuit including a diode element and a capacitor, in which a second supply voltage is supplied to an anode of the diode element, a cathode of the diode element is connected to a first electrode of the capacitor, the level shift voltage is supplied to a second electrode of the capacitor, and the first supply voltage is generated at a connection point of the cathode of the diode element and the first electrode of the capacitor and supplied to a driver circuit;

a switching transistor in which a signal output from the driver circuit is input to a gate of the switching transistor, a third supply voltage is supplied to a drain of the switching transistor, and a smoothing circuit having an inductor and a smoothing capacitor and generating the level shift voltage is connected to a source of the switching transistor; and a voltage supply line configured to connect the level shift input port and the source of the switching transistor in order to supply a switching signal generated from the source side of the switching transistor to the level shift circuit.

9. The switching regulator of claim 8, wherein the smoothing circuit further comprises a flywheel diode in which a ground is connected to an anode of the flywheel diode and the inductor is connected to a cathode of the flywheel diode.

* * * * *